ates Patent [19]

United States Patent [19]

Howell, deceased

[11] 4,204,882
[45] May 27, 1980

[54] THERMOCOUPLE SPLIT FOLLOWER

[75] Inventor: Louis J. Howell, deceased, late of Upper Merion Township, Montgomery County, Pa., by Diane Howell, executrix

[73] Assignee: The United States of America as represented by the United States Department of Energy, Washington, D.C.

[21] Appl. No.: 512,824

[22] Filed: Dec. 3, 1965

[51] Int. Cl.² .................................................. H01L 35/04
[52] U.S. Cl. ................................... 136/202; 136/208; 136/221
[58] Field of Search ............... 136/221, 229, 230, 202, 136/208; 62/3; 310/4

[56] References Cited

U.S. PATENT DOCUMENTS

| 894,216 | 4/1962 | Licentia ................................. 138/99 |
| 2,976,340 | 3/1961 | Hemicke et al. ....................... 136/203 |
| 3,269,875 | 8/1966 | White ..................................... 136/212 |

Primary Examiner—Maynard R. Wilbur
Assistant Examiner—Richard E. Berger
Attorney, Agent, or Firm—R. V. Lupo; Cornell D. Cornish

[57] ABSTRACT

Thermoelectric generator assembly accommodating differential thermal expansion between thermoelectric elements by means of a cylindrical split follower forming a slot and having internal spring loaded wedges that permit the split follower to open and close across the slot.

5 Claims, 7 Drawing Figures

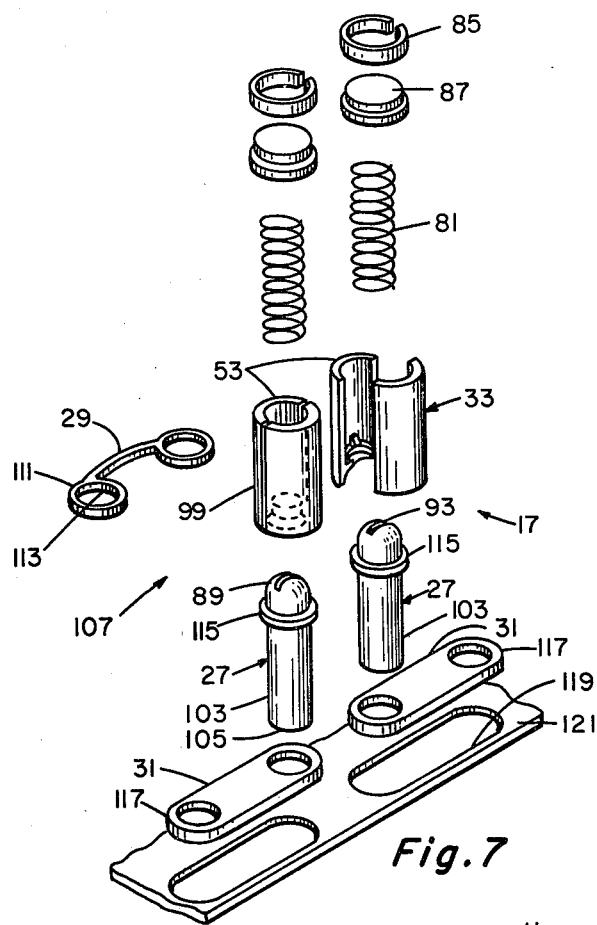
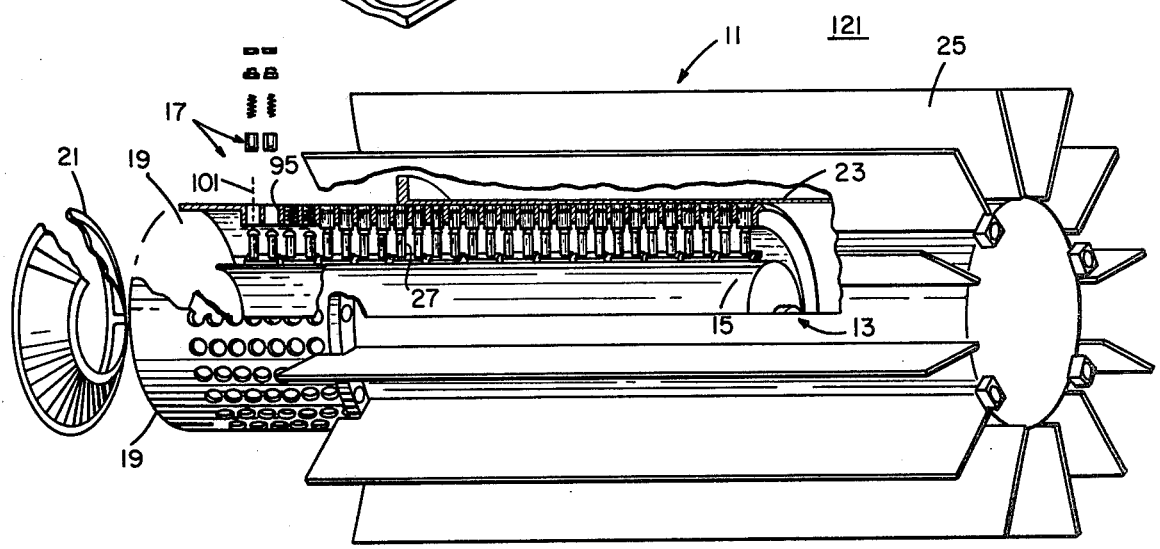

THERMOCOUPLE SPLIT FOLLOWER

This invention relates generally to radioisotope heated thermoelectric generators and more particularly to radioisotope heated thermoelectric generators in which differential thermal expansion is obtained by utilizing thermocouple split followers.

In radioisotope heated thermoelectric generators a need exists for thermocouples that can be assembled at low temperatures and can operate in a high temperature system without changing the electrical connection between the thermocouple or the thermal connection between the radioactive heat source, the thermocouples and the heat rejection radiators. These temperatures are between room temperature and about 1499° F. or higher. Systems having rigidly interfitting thermocouple assemblies do not operate properly at such temperaure differentials. Others, such as those that employ bonded thermocouple assemblies are subject to breakage, cracking, changes in their thermal flow or are costly, inefficient, or unpredictable in their electrical outputs. It is additionally desirable to provide an easily assembled and disassembled, differential thermal expansion thermocouple system with minimum (i.e. zero) clearance between its parts and low space and weight requirements.

It is, therefore, an object of this invention to provide thermocouples utilizing split followers for providing differential thermal expansion between the thermocouples and the followers;

It is also an object of this invention to provide for a substantially uniform thermal connection from a radioisotope heat source to a heat sink through thermocouples adapted to operate with a large predictable temperature gradient therein over a wide temperature range;

It is also an object of this invention to provide a radioisotope heated thermoelectric generator having minimum clearance between the thermocouples and their contacting components;

It is also an object of this invention to provide substantially constant surface contact and surface contact pressure between the thermocouples and their contacting surfaces;

It is also an object of this invention to provide selectively removable and easily assembled thermocouples in a radioisotope heated thermoelectric generator;

It is a further object of this invention to provide for suitably honing the contacting surfaces of the thermocouples, thermocouple followers and cold frame for the followers.

The foregoing objects are achieved by providing differential thermal expansion between the thermocouples and split followers therefor. These followers are arranged, in one embodiment, with internal spring loaded wedging means for laterally thrusting symmetrical split follower halves for opening longitudinally extending gaps between the two follower halves whereby the follower is interposed with zero clearance between the thermocouple and the heat rejection radiator for efficiently connecting the heat source to the radiator through the thermocouple. Moreover, with the proper selection of components and hemispherical interfaces, the desired substantially constant contact surfaces, pressures and thermal connection is provided, errors of construction and assembly due to approximation are limited to small and permissable values or become unimportant, and the thermocouples and their followers are honed together in place.

In the drawings where like parts are marked alike:

FIG. 1 is a partial three dimensional view of the radioisotope heated thermoelectric generator of this invention;

FIG. 7 is a partial exploded view of a simple thermocouple system in which differential thermal expansion and minimum clearance of the parts is provided in accordance with the principles of FIG. 2;

Figure 4:
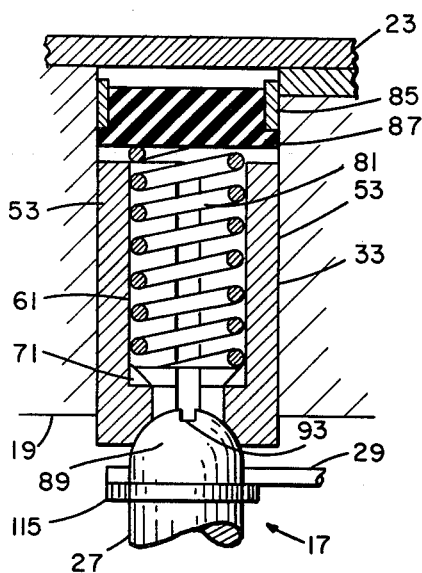
FIG. 4 is a partial three dimensional view of the spring means of FIG. 2.

Referring now to FIG. 1 a 40-watt generator 11 is shown composed of seven major sub-assemblies. These are radioisotope heat source 13, hot frame 15, thermopile assembly 17, cold frame 19, hermetic seal assembly 21, outer shell 23 and radiator fins 25.

The heat source 13 advantageously comprises plutonium 238 in a form capable of operating at sufficient temperature to provide a high temperature gradient from the source 13 through the hot frame 15, the thermopile assembly 17, and the cold frame 19 to the outer shell 23 and radiator fins 25 seriatim. Other radioactive materials may be used, however, such as strontium 90, as is well known in the art.

The hot frame 15 forms a capsule for completely containing the source 13. To this end the hot frame 15 comprises a high strength metal that withstands high impact loads as well as corrosive environments for long periods of time. The hot frame also supports the hot side of the thermopile assembly and mechanically connects, such as by welding, with the conical hermetic seal assembly 21 for support and for sealing the inside of cold frame 19 and shell 23 from the ambient environment.

The thermopile assembly 17 is disposed between the hot frame 15 and the cold frame 19 whereby the heat flow from the source 13 to the outer shell 23 and fins 25 produces the required thermocouple temperature gradient from the hot junctions to the cold junctions thereof, and the corresponding required electrical output. Advantageously, these thermoelectric elements 27 are connected in series, although a parallel or series-parallel arrangement can alternately be used, and comprise semi-conductors of alternate P-type and N-type materials. Suitable N and P type materials comprise Pb-Te, Pb-Sn-Te, and Bi-Sb-Te. Other thermoelectric materials, however, may be used, comprising GaSb rich alloys and N-type In As-GA As and P type Si-Ge. The straps 29 and 31, as shown in FIG. 7, connect electrically adjacent thermocouples together in the manner of a flexible ladder assembly with as many thermoelements 27 as are required to obtain the required voltage and current outputs.

Figure 2:
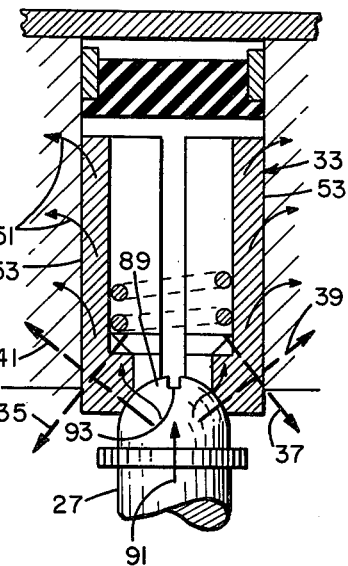
FIG. 2 is a partial schematic diagram of the principles involved in this invention.

Should the thermoelements 27 be provided with split followers 33 in an arrangement for providing uniform lateral thrust forces 35, 37, 39 and 41 as shown in FIG. 2, the thermocouples 27 will provide substantially uniform thermal contact with the followers 33 and the followers will provide substantially uniform thermal contact with cold frame 19 thereby producing a thermal gradient producing heat flow to the cold frame as indicated schematically by arrows 51. Also, there is zero clearance between the thermocouples 27, the followers and their contacting parts while differential thermal expansion there between over a wide temperature range is provided.

Figure 3:
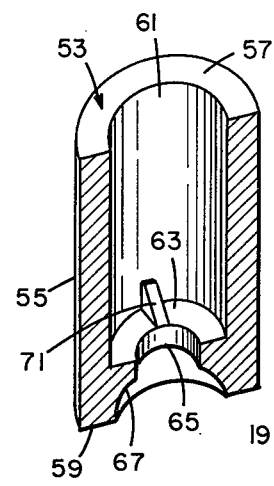
FIG. 3 is a partial three dimensional view of the wedging means of FIG. 2.

In explaining how these features are obtained reference is made to FIGS. 3 and 4 wherein is shown, for ease of explanation, one half 53 of one split follower 33 having another like symmetrical half. Each half 53 has a cylindrical outside surface 55 terminating in flat semicircular ends 57 and 59, and a co-axial cylindrical inside surface 61 terminating in a flat semicircular surface 63. This flat surface 63 is disposed around semi-circular annulus 65 terminating in a semi-hemispherical surface 67 connected with flat end 59. The inside surfaces 61 and 63 also connect with a wedge shaped inclined plane 71 that extends from inside cylindrical surface 61 to the inside diameter of flat surface 63 that forms semi-circular annulus 65.

As shown in FIG. 4, the outside diameter of helical spring 81 corresponds to the curvature of the inside split follower surface 61 and extends from inclined plane 71 to the top of the split follower half 53 and its adjacent half whereby the spring is contained by the two halves of the split follower 33. The compression of split retaining ring 85 in cold frame 19 holds plug 87 for suitably compressing the spring 81 for the assembly of the outer shell 23 onto the cold frame 19. The split retaining ring needs sufficient strain storage only at the room assembly temperature as thereafter the outer shell 23 insures that the slit ring 85 and the plug 87 compress spring 81.

It will be understood from the above that the helical spring 81 bears on the inclined plane 71 of the split follower 33 to develop lateral components of force 35 and 37 that spread apart the two halves 53 of the follower 33. Additional lateral spreading components of force 39 and 41 are obtained by the bearing of the split follower onto the hemispherical thermoelectric element end 89. In this regard if the semi-cylindrical cut outs 67 did not exist in the split follower 33 this additional spreading action would not be developed, particularly if the point of contact was on the assembly centerline 91 shown in FIG. 2. The compression of the spring 81 between follower 33 and plug 87 thus holds the thermocouple 27 in uniform thermal connection against the follower at the cold end of the thermocouple 27 and also in uniform thermal connection with the hot frame 15 at the hot end of the thermocouple 27.

Figure 6:
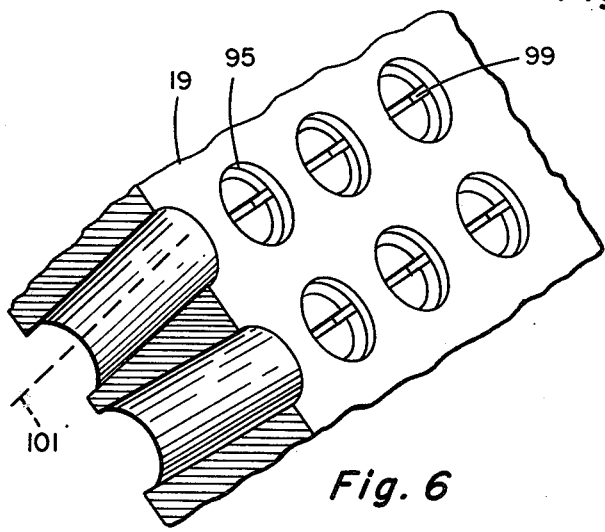
FIG. 6 is a partial three dimensional assembly view of the parts of FIG. 2.

With the described thermocouple system there is no need to provide clearance between the follower 33 and the cold frame hole 95, shown in FIG. 6, to insure that there will be no jamming of the follower due to differential thermal expansion of the follower and the cold frame or the thermo couple 27 and the follower 33. There is simple line contact between the follower 33 and the cold frame hole 95 and as will be understood in more detail hereinafter, there is no force except differential expansion of the components that biases the follower in the hole 95. Advantageously, the follower 33 develops four line contacts, two line contacts per follower half 53. To this end each follower half 53 has a radius of curvature on its outside surface 55 that is at least as great as the radius of curvature of the cold frame hole 95. Moreover, these four line contacts are uniform in contact pressure since the spreading action of the split follower is uniform. Thus, the split follower of this invention provides uniform thermal connections and minimum need for tight machining tolerances.

Figure 5:
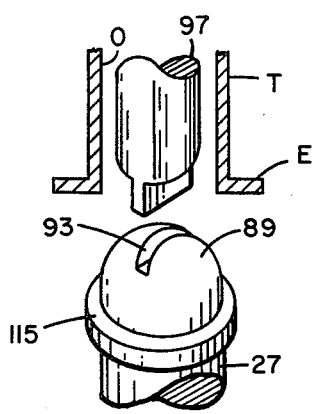
FIG. 5 is a partial three dimensional view of the honing system of this invention for the apparatus of FIG. 2.

It will be seen from FIG. 4 and FIG. 5 that the hemispherical thermocouple end 89 has a screw driver slot 93. This slot 93 along with the inclined plane 71 and semi-hemispherical cut out 67 in the split follower 33 provide means for honing the split follower into the hole 95 in the cold frame 19 and onto the hemispherical end 89 of the split follower 33. To this end the follower 33 is turned by a cylindrical tool T having ears E that rotate against inclined planes 71 while thermocouple holding screw driver shaped fixture 97, passes through hole O in tool T and fits into slot 93 to prevent the movement of the thermocouple 27 or the shunt straps therefor due to the torque developed during the honing operation. The semi-hemispherical cut out 67 in the split follower 33 provides access for the thermocouple holding fixture 97 and the inclined plane 71 in the split follower 33 serves as a dog for the spinning tool that accomplishes the turning of follower 33. Advantageously this honing is done prior to assembly of the helical spring 81.

FIG. 6 shows the preferred orientation of the split followers 33. It will be understood that the slot 99 between the follower halves 53 is coaxial with the axis 101 of the hole 95 in the cold frame 19. This minimizes the hazard of jamming the followers 33 in the cold frame hole 95 even if there is a pinch effect from the shrinkage of the outer shell 23 on the cold frame 19.

A practical arrangement for efficiently accomplishing the desired differential thermal expansion in the thermocouple system of this invention is shown in FIG. 7, which is an exploded view of the thermocouple subassembly 17. This assembly has 24 rows of thermoelectric couples 27 arranged circumferentially around the hot frame 15, with 14 couples 27 per row, but for ease of explanation only two couples 27 are shown. All 336 couples 27 are series-connected to provide approximately 28 volts at the generator output terminals. Each thermoelectric leg 103 is seated in a recessed hot junction electrode 31 constructed of iron and electrical contact with this electrode is maintained by spring force transmitted via beryllium follower 33 and element cap ends 89 at the cold end of the thermocouple assembly 17.

The split follower assembly 107 obtains minimum clearance and maximum contact area for effective heat conduction to the beryllim cold frame, this minimum (i.e. zero) clearance being maintained from assembly to operating temperature. To this end, the use of beryllium for both the cold frame 19 and followers 33 insures a single coefficient of thermal expansion, which is essential to minimize clearances. As is understood from the above, this minimum (i.e. zero) clearance is maintained while sufficient contact pressure is maintained with practical machining tolerances and maximum contacting hemispherical thermocouple element ends 89.

Follower spring 81 bears at one point on each half of split follower 33, this point being the inclined ramp or fillet segment 71. The result of this design is that the spring force has a component that thrusts each follower half 53 outward against the wall of the cold frame holes 95. Additional side thrust is obtained by the spreading action of the hemispherical thermoelectric element cap end 89. The radius of the follower is at least as great as that of the cold frame hole 95, so that there is double line contact for each half 53 of the split follower 33. Similarly the radius of the spherical seats 67 in the followers 33 is the same as or slightly less than the spherical radius of thermocouple end 89, double point contact exists for each half of the split follower surface 67.

These line contacts and or point contacts are transformed into complete, uniform surface contacts by honing the mating parts together. To this end, previous to installing the follower spring 81, tool T spins the follower 33 in cold frame hole 95, and against thermocouple end 89 by turning against the ramp like fillet 71 which provides a spinning dog while the tool 97 in slot 93 in the top of the thermocouple cap end 89 locks the thermocouple 27 to resist the imparted torque due to friction. Since the follower must be electrically insulated from the hemispherical cap end 89 and/or the cold frame 19, the follower is beryllium oxide coated beryllium, applied by metal vaporization or spraying techniques, as are well known. This oxide coating is applied in sufficient thickness to serve as an abrasive for honing the follower in the cold frame hole 95 and against the thermocouple ends 89. The problem of introducing metal or oxide particles into the thermoelectric element assembly during the honing operation is prevented by providing internal pressurization to blow the particles outwardly. Also, the freely interfitting system of this invention permits the removal and inspection of the parts to determine the burnishing of the parts.

An expansion type pressure ring is used to retain the follower spring in the cold frame during assembly prior to fitting the outer shell 23 on the cold frame 19. The use of a smooth, straight-through hole 95 in the cold frame 19, rather than a blind hole, and the use of the expansion ring 85, rather an interior retaining groove for the retaining ring avoids costly and difficult machining as well as the dangers of crack propogation. A retaining insulator disc 87 serves as back-up electrical insulation between the spring 81 and outer shell 23.

Since there is no ring groove in the cold frame hole 95 the split follower 33 minimizes hoop stress deformation of the cold frame 19 during the shrink fitting of the shell 23 thereon. Moreover, this deformation is localized at the holes 95 and does not cause binding of the followers and high stress concentrations, such as would be present if ring grooves were used. Full advantage of this aspect is further provided by aligning the slots 99 between the follower halves 53 with the axis of the cylindrical outer shell 23 and also with the axis of holes 95 in the cold frame.

The spherical thermoelement end 89 is an integral part of the thermoelement 27 and is electrically joined to the adjacent thermoelement by cold junction electrode 29 having holes 113 in rings 111 that fit down on ends 89 against shoulders 115 on thermoelements 27. The hot junction electrodes 31 rest in recessed cut outs 119 in boron nitride insulating strips 121 which pin to one end of hot frame 15 and freely slide at the other end thereof.

Powdered (crushed) thermal insulation, such as Min K brand insulation, occupies the region between thermocouples 27, while a formed block of solid insulation (not shown) inserts into the hermetic seal ring 21 and the opposite end of thermopile assembly 17 to retain the crushed insulation during the enclosing operations. The entire annular thermopile region 17, bounded by the beryllium hot frame 15 on the inside and the beryllium outer shell 23, is hermetically sealed after back filling with an inert gas at 0.5 atmospheres pressure. The conical hermetic seal assembly 21 is also composed of a beryllium framework with 5 mil thick Inconel pressure bonded to it to seal the cut outs between the spoke ribs thereof. T-sections give overall rigidity to these spoke ribs of this beryllium frame while the thin low conductivity Inconel skin provides minimum heat path losses therethrough from the hot frame 15 to the cold frame 19.

Circumferential electron beam welds join the beryllium seal ring to the beryllium hot frames 15 and cold frame 19. The cold frame 19 positions the element assemblies and is aligned to the outer shell by a machined tapered mating surface. Axial expansion is restricted in one direction. The cold frame 19 is shrink-fitted to the outer shell 23 to provide the required pressure for good thermal conductance. The outer shell 23 carries the major loads for transferring the generator load to the launch vehicle for space operation. The shell also carries 12 tapered beryllium radiator fins attached to the outer shell surface by longitudinal electron beam welding.

In operation, heat source 13 transfers heat seriatim to hot frame 15, thermopile assembly 17, cold frame 19, outer shell 23, fins 25 and cold ambient space 121 to provide a heat gradient across thermocouples 27 and the desired electrical power output therefrom. This heat causes the thermoelements to expand longitudinally along their axes at room temperature or the site ambient assembly temperature to decrease the distance from the thermocouple end 89 to the inside of outer shell 23. The end 89 thereby pushes against the hemispherical surfaces 67 of the followers 33 to produce lateral forces 39 and 41 tending to spread the follower gap 99. The compressed force of spring 81 also pushes against planes 71 to produce lateral forces 35 and 37 which also tend to spread this gap 99. These reaction forces push the follower outside 55 against the inside of cold frame holes 95 and the follower hemispheres 67 against the thermocouple ends 89. The net result provides uniform thermal connections through the thermocouples 27 and followers 33 from the heat sources 13 to the ambient 121 with a large temperature gradient over a wide differential expansion producing temperature range. Likewise any other differential expansion between the parts of assembly 17 does not change the thermal connections through the thermocouples from source 13 to ambient 121.

The operation of the generator 11, wherein the source 13 cools by radionuclide decay, reverses the described differential expansion. Thus the thermocouples 27 become shorter longitudinally along their axes to increase the distance between the thermocouple end 89 and the inside of outer shell 23 while the compressed force in spring 81 maintains the uniform thermal connection between the follower outside 55 and the inside of cold frame hole 95 and the uniform thermal connection between the hemispherical surfaces 67 and 89 of the follower and thermocouples 27, as well as the thermal connection between the hot end of the thermocouples 27 and the hot frame 13. Likewise any other differential contraction between parts of assembly 17 does not change the thermal connection through the thermocouples 27 from source 13 to ambient 121.

For purposes of illustration the following lists the components that are advantageously used:

TABLE I

| | |
|---|---|
| Retaining ring 85 | Inconel X |
| Insulating plug 87 | PD 300 silicone rubber |
| Spring 81 | Inconel X |
| Cold junction electrode 29 | Silver (brazed to thermocouple 27) |
| Split follower 33 | Beryllium |

TABLE I -continued

| | |
|---|---|
| Element end cap 89 | Mild steel-nickel plated (brazed to thermocouple 27) |
| Thermocouple leg assembly | Lead telluride segmented N leg bonded to cap 89 |
| Thermocouple leg assembly | Lead telluride segmented P leg bonded to cap 89 |
| Hot junction electrode | Armco iron |
| Hot side electrical insulation | Boron nitride |

TABLE II

| | |
|---|---|
| Design life | 1 yr. |
| Overall length | 19.66 in. |
| Overall diam. (across fins 25) | 18.98 in. |
| Volume | 5570 cu. in. |
| Total thermal watts | 2020 |
| Output voltage | 28V |
| Hot junction temp. °F. | 1150 |
| Cold junction °F. | 510 |
| Fuel inner surface °F. | 1499 |
| Cold frame °F. | 495 |
| Fin base (and shell) °F. | 490 |

This invention has the advantage of providing a simple, efficient, dependable and predictable radioisotope heated thermoelectric generator for terrestial and space application for the generation of electrical power for long periods of time in a system whose components differentially expand and contract due to large temperature gradients over a wide temperature range. Moreover, the system of this invention provides low weight and space requirements by the use of zero clearance components and provides uniform thermal connections through the thermocouples from the generator heat source to the generator heat sink while at the same time permitting differential thermal expansion. Provision is also made for easily and quickly assemblying the system components and for honing the parts to provide uniformly good thermal connections with practical machining tolerances.

What is claimed is:

1. A radioisotope heated thermoelectric generator assembly, comprising a plurality of thermocouples having first and second ends, said first ends having a hot frame connected thereto and said second ends having a cold frame connected thereto, said cold frame having two symmetrical split follower halves, and means for urging the outside of said split follower into contact with said cold frame, comprising hemispherical mating surfaces between said followers and said thermocouples, resilient spring means for urging said thermocouples and followers longitudinally oppsitely into contact with each other, and tapered wedge means in said followers that react with said spring means for urging said split follower halves apart.

2. A radioisotope heated thermoelectric generator assembly, comprising a cold frame forming holes therein, a plurality of thermocouples having first and second ends, said first ends having a hot frame connected thereto and said second ends having a hemispherical shape forming a slot therein, a cylindrical shaped follower having a first end, a hemispherical second opposite end and opposite wedge shaped fillets on the inside thereof, said follower being split to form symmetrical split follower halves having a longitudinally extending gap therebetween, and resilient means for urging said hemispherical second follower end against said second end of said thermocouple for the urging outside of said follower halves against the inside of said cold frame.

3. A radioisotope heated thermoelectric generator assembly, comprising a cylindrical shell, an annular cold frame inside said shell forming holes therein at right angles to said shell axis, a plurality of thermocouples having first and second ends, said first ends having a hot frame connected thereto and said second ends having a hemispherical shape forming a slot therein, cylindrical shaped followers having a first end, a hemispherical opposite second end and opposite wedge shaped fillets on the inside thereof adjacent said second follower end, said follower being split to form symmetrical split follower halves having a longitudinally extending gap therebetween equi-distant from said fillets, and resilient means disposed between the inside of said shell and said wedge shaped fillets for urging said second ends of said followers and thermocouples respectively against each other for urging the outside of said followers against the inside of said holes in said cold frame.

4. A radioisotope heated thermoelectric generator assembly comprising a thermocouple having a first and second ends, said first end having a hot frame connected thereto and said second end having a cold frame connected thereto, said cold frame having two symmetrical split follower halves, means for holding said thermocouple from rotation, and means for relatively rotating said follower halves to hone the folower halves against the second end of said thermocouple.

5. A radioisotope heated thermoelectric generator assembly, comprising a cold frame having a hole therein, a thermocouple having a first and second ends, said first end having a hot frame connected thereto and said second end forming a slot and having two symmetrical split follower halves, means for holding said thermocouple from rotation, and means for relatively rotating said follower halves for honing the follower halves against the second end of said thermocouple and the inside of said hole in said cold frame.

* * * * *